(12) United States Patent
Chen

(10) Patent No.: US 6,753,954 B2
(45) Date of Patent: Jun. 22, 2004

(54) METHOD AND APPARATUS FOR DETECTING ABERRATIONS IN A PROJECTION LENS UTILIZED FOR PROJECTION OPTICS

(75) Inventor: J. Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 458 days.

(21) Appl. No.: 09/729,695

(22) Filed: Dec. 6, 2000

(65) Prior Publication Data
US 2003/0098970 A1 May 29, 2003

(51) Int. Cl.[7] ................................. G01B 9/00
(52) U.S. Cl. ...................................... 356/124
(58) Field of Search ....................... 356/124, 388–401; 382/141, 145, 151, 152, 181, 190, 207, 211; 430/5, 22, 30

(56) References Cited

U.S. PATENT DOCUMENTS 6,296,977 B1 * 10/2001 Kaise et al. .................. 430/30

* cited by examiner

Primary Examiner—Tu T. Nguyen
(74) Attorney, Agent, or Firm—McDermott, Will & Emery

(57) ABSTRACT

A method of detecting aberrations associated with a projection lens utilized in an optical lithography system. The method includes the steps of forming a mask for transferring a lithographic pattern onto a substrate, forming a plurality of non-resolvable features disposed on the mask, where the plurality of non-resolvable features are arranged so as to form a predetermined pattern on the substrate, exposing the mask using an optical exposure tool so as to print the mask on the substrate, and analyzing the position of the predetermined pattern formed on the substrate and the position of the plurality of non-resolvable features disposed on the mask so as to determine if there is an aberration. If the position of the predetermined pattern formed on the substrate differs from an expected position, which is determined from the position of the plurality of non-resolvable features, this shift from the expected position indicates the presence of an aberration.

41 Claims, 10 Drawing Sheets

*(PRIOR ART)*

(PRIOR ART)

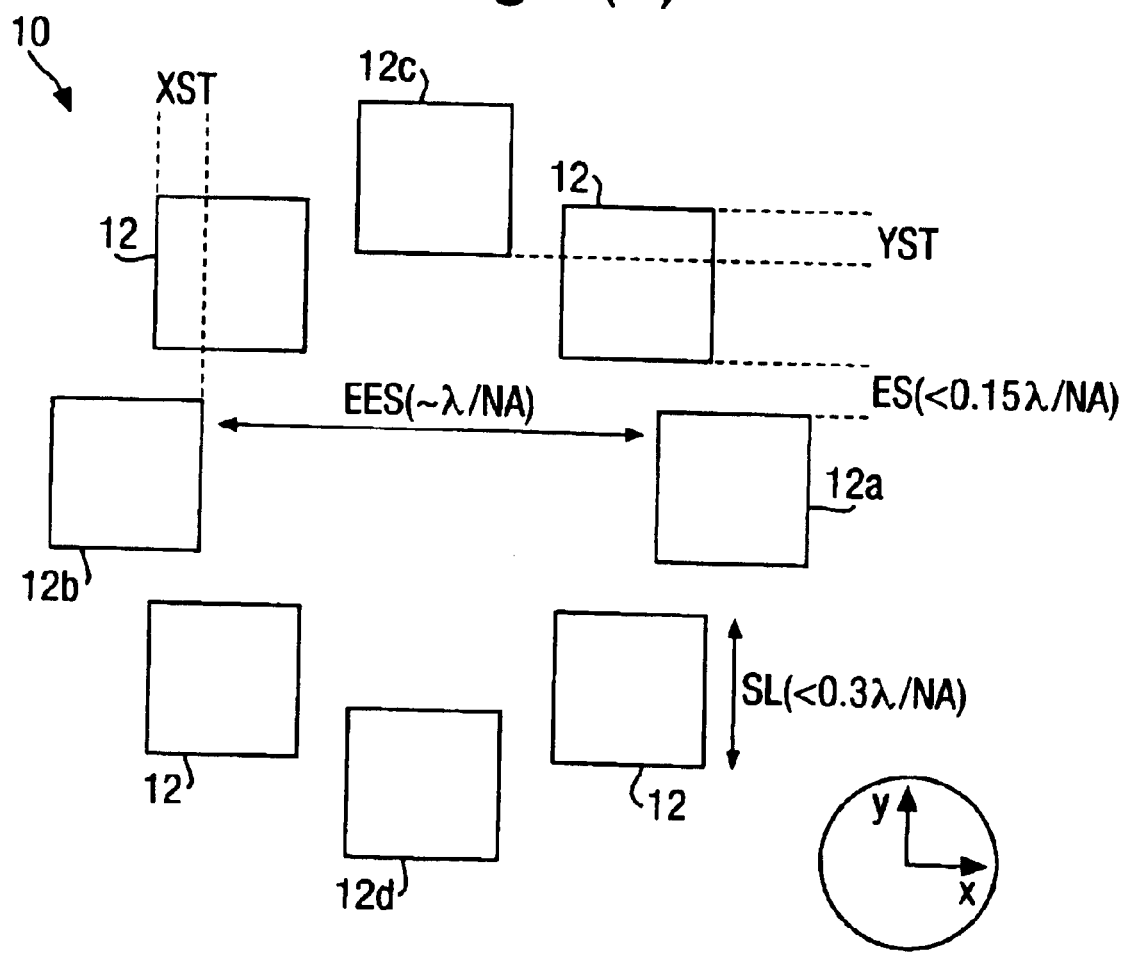

PRIOR ART
Fig.4(a).
PRIOR ART
Fig.4(d).
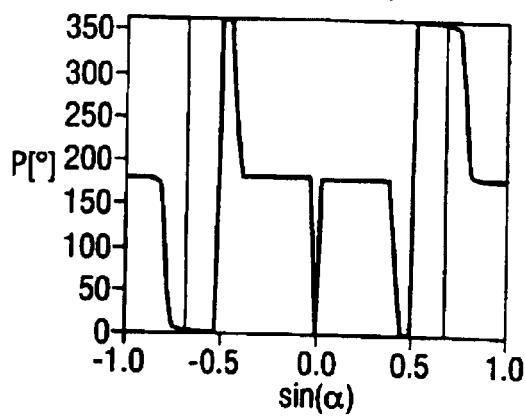
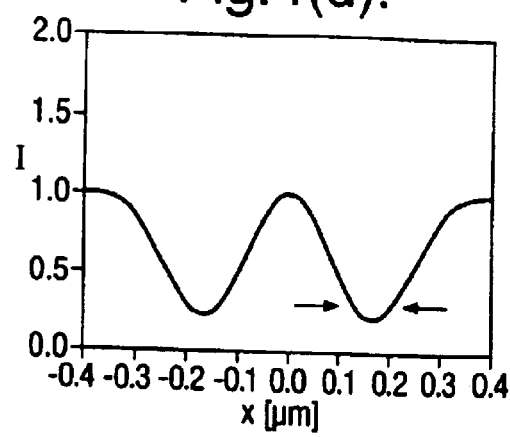
PRIOR ART
Fig.4(b).
PRIOR ART
Fig.4(e).
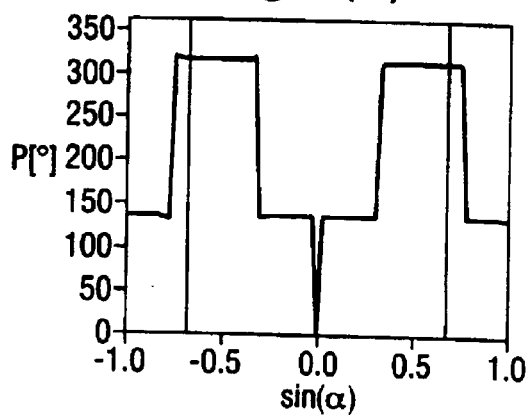
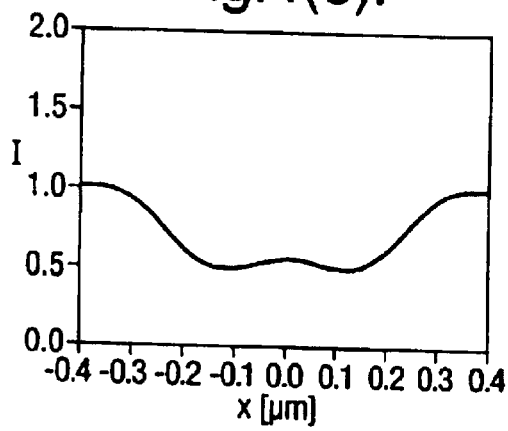
Fig.4(c).
Fig.4(f).
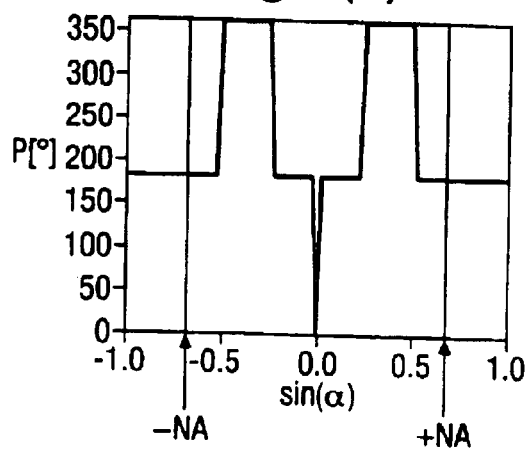
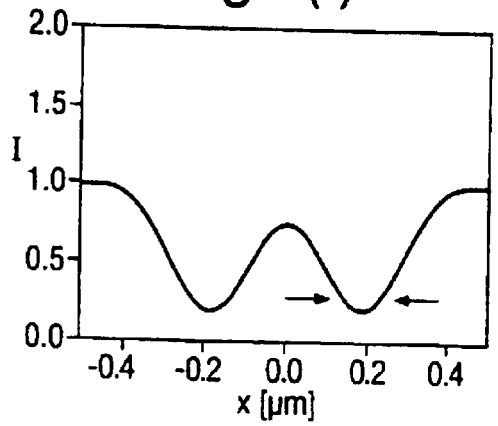

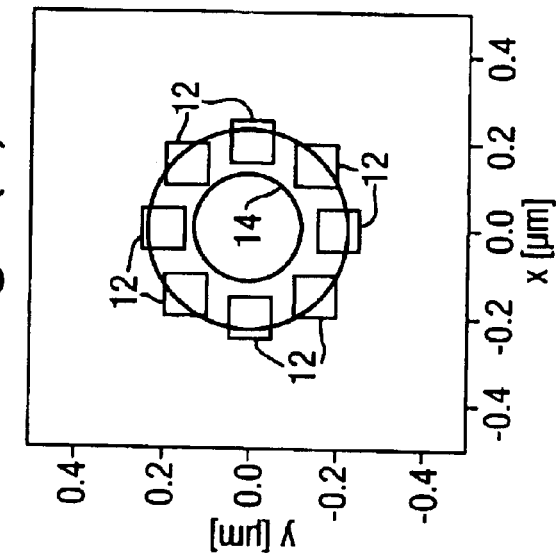
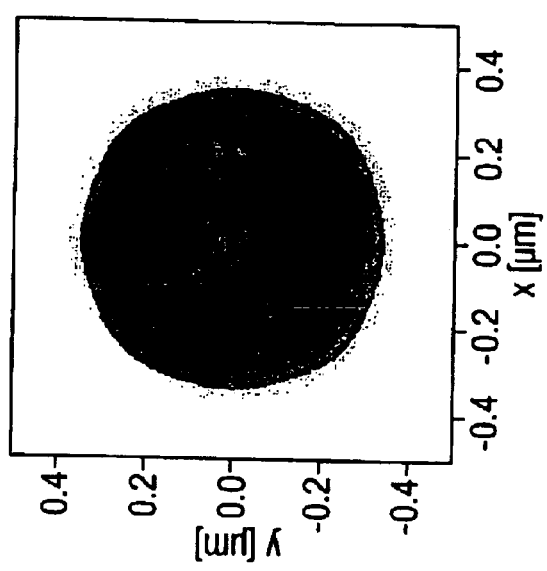
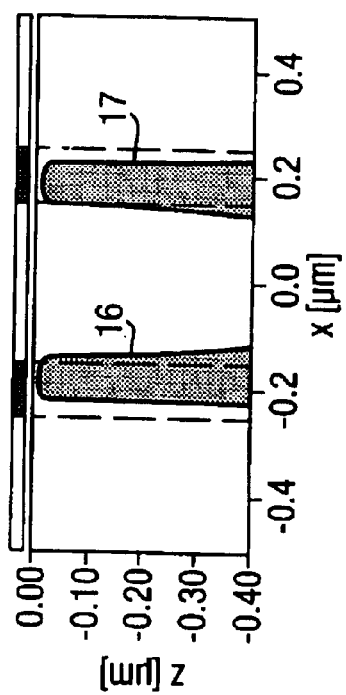

METHOD AND APPARATUS FOR DETECTING ABERRATIONS IN A PROJECTION LENS UTILIZED FOR PROJECTION OPTICS

FIELD OF THE INVENTION

The present invention relates to the detection of lens aberrations associated with the projection lens utilized in a lithography system and more particularly to the design, layout and application of lens-aberration monitoring structures that can be used to monitor the projection lens performance during the manufacture of semiconductor devices.

BACKGROUND OF THE INVENTION

Lithographic apparatus may employ various types of projection radiation, non-limiting examples of which include ultra-violet light ("UV") radiation (including extreme UV ("EUV"), deep UV ("DUV"), and vacuum UV ("VUV")), X-rays, ion beams or electron beams. Depending on the type of radiation used and the particular design requirements of the apparatus, the projection system may be for example, refractive, reflective or catadioptric, and may comprise vitreous components, grazing-incidence mirrors, selective multi-layer coatings, magnetic and/or electrostatic field lenses, etc; for simplicity, such components may be loosely referred to in this text, either singly or collectively, as a "lens".

In a manufacturing process using such a lithographic projection apparatus, a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the images features. This array of procedures is used as a basis to pattern an individual layer of a device, e.g., an integrated circuit (IC). Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes may be obtained, for example, from the book "Microchip Fabrication: A Practical Guide to Semiconductor Processing", Third Edition, by Peter van Zant, McGraw Hill Publishing Co., 1997 ISBN 0-07-067250-4.

The current state of integrated circuit (IC) fabrication requires lithography processes to provide for patterning feature line widths to near one-half of the exposure wavelength. For the 150 nm device generation, the krypton fluoride (KrF) excimer laser (248 nm) is typically selected as the exposure source of choice. Recent research and development efforts have further demonstrated the possibility of utilizing the KrF excimer laser for the 130 nm device generation. This is achieved by combining the use of multiple resolution enhancement techniques (RET), such as, attenuated phase-shifting masks (attPSM) and off-axis illumination (OAI), in combination with optical proximity correction (OPC) techniques. One possible alternative to the foregoing techniques is to use a shorter exposure wavelength, for example, an argon fluoride (ArF) excimer laser having a wavelength of 193 nm. However, due to various complications associated with the use of the ArF excimer laser, it is likely that the KrF excimer laser will be the dominant laser of choice for fabricating the 130 nm device generation.

Regardless of the excimer laser utilized in the fabrication process, the fabrication of devices having critical dimensions of 150 nm or less requires that the near-diffraction-limited lens utilized in the fabrication process be substantially aberration free. As is known, aberrations can be caused by various sources, such as a defective lens or an aging laser which emits a beam having a frequency shifted from the desired value. Accordingly, it is desirable to verify lens performance (i.e., qualify the lens) prior to installation, and then to subsequently monitor the lens performance during use (e.g., in an IC fabrication process).

During the lens manufacturing process, the lens performance can be fully tested interferometrically. Typically, the lens is first qualified at the factory and then again during the initial installation in the field. One common practice utilized for lens qualification is to print wafers and then measure the dimensions of the minimum feature width, or the critical dimension (CD). During this qualification process, both "vertical" and "horizontal" features are measured (i.e., features extending in two orthogonal directions on the substrate plane). In some instances, the CD for 45-degree features is also measured. In order to verify lens performance, a sufficient number of CD measurements are required across the entire exposure field. The results of the CD measurements are then analyzed to determine whether or not the lens performance is acceptable.

Although the CD measurement method provides a method of evaluating the performance of the lens, it is not a simple task to correlate the CD data to the "signature" of the lens aberration. Accordingly, there have been efforts to perform a direct observation of lens aberrations. For example, an article by Toh et al. entitled "Identifying and Monitoring of Lens Aberrations in Projection Printing," SPIE Vol. 772, pp. 202–209 (1987) described methods for measuring the effects of relatively large lens aberrations of about $0.2\lambda$, where $\lambda$ is the exposure wavelength. However, for today's near-diffraction-limited optics, any lens aberration is likely to be in the neighborhood of $0.05\lambda$, or smaller. For 130 nm features, a $0.05\lambda$ lens aberration translates to a 12.4 nm dimensional error when utilizing the KrF exposure source. Accordingly, if the feature CD budget (i.e., error tolerance) is assumed to be ±10% of the target feature width, a 12.4 nm error consumes almost the entire CD budget.

In an article by Gortych et al. entitled "Effects of Higher-Order Aberrations on the Process Window," SPIE Vol. 1463, pp. 368–381 (1991) it was demonstrated that higher-order lens aberrations could deteriorate lithographic process windows. Unfortunately, the higher-order lens aberrations are difficult to eliminate after the photolithography system is assembled. In an article by Brunner entitled "Impact of Lens Aberration on Optical Lithography," INTERFACE 1996 Proceedings, pp. 1–27 (1996) simulation was utilized to demonstrate the negative impact of near-wavelength features due to several first-order lens aberrations. Specifically, it was possible to observe coma aberrations by examining how the contact features were printed when utilizing attenuated PSM. It is also known that that lens aberrations can be balanced with custom off-axis illumination. Others have attempted to make direct measurements of various kinds of lens aberrations in an effort to achieve better CD control.

An article by Farrar et al. entitled "Measurement of Lens Aberrations Using an In-Situ Interferometer Reticle," Advanced Reticle Symposium, San Jose, Calif. (June 1999) reported the use of an in-situ interferometer reticle to directly measure lens aberration. According to Farrar, it was possible to derive lens aberrations up to 37 Zernike terms. Although Farrar claims that the method is accurate and repeatable, it involves hundreds or thousands of registration type measurements (i.e., the measuring of the shift in relation to the intended feature position). As such, while Farrar's method may be accurate and repeatable, with the need for such exhaustive measurements, the method is clearly very time consuming, and therefore likely unusable in a manufacturing-driven environment. Furthermore, it is conceivable that minute lens aberrations can drift over time due to various reasons (e.g., as a result of the periodic preventive maintenance performed on a system). Thus, as it is critical to monitor lens performance on a periodic basis, the use of Farrar's method, which requires substantial measurements and calculations, is impractical. Accordingly, there is a need to be able to monitor the lens aberration directly from the printed product wafers.

In an effort to accomplish this objective, in 1999 Dirksen et al. (see, U.S. Pat. No. 6,248,486, filed Sep. 29, 1999, incorporated herein by reference) proposed a method for directly monitoring lens aberration from the printed wafers. According to Dirksen's method, the lens monitor comprises simple circular features on the reticle. More specifically, the circular feature is a chromeless feature that has been etched into the glass substrate of the reticle. The etched depth is typically $\lambda/2$ and the diameter is about ($\lambda/NA$), where NA is the numerical aperture of the projection lens. According to Dirksen, the method has proven to be effective. Further, the structure is simple and small enough to be readily placed throughout the entire exposure field.

Still, there are a number of issues concerning the use of Dirksen's lens aberration monitor. First, the depth of the lens monitor feature on the mask needs to be etched to approximately half of the wavelength. For a special-purpose mask, there is no problem dedicating an extra (or special) mask making process step to fabricate such a feature. However, for production reticle types, such as a binary chrome reticle or attPSM, an extra mask making process step necessary to create such a monitor is costly and time-consuming process. Alternating PSM (altPSM) or chromeless PSM (CLM) would also require the extra mask making process step. Further, since the Dirksen monitor calls for a different etch depth in the quartz substrate as opposed to the $\pi$-phase, it requires a special etch time and must be done separately.

A second issue with Dirksen's lens monitor is that it is vulnerable to phase error that may result from the quartz etch process during mask formation. More specifically, referring to FIGS. 1(a)–1(f), for an exacerbated phase error, the quartz etch process causes a sloped edge profile on the mask as shown in FIG. 1(a). In such a case, the Dirksen monitor loses all of the sensitivity to indicate any possible lens aberration. However, when there is no phase-error on the mask, as shown in FIG. 1(d), the Dirksen monitor is effective for detecting lens aberrations. FIGS. 1(b) and 1(e) illustrate a cross-sectional view of the printed resist pattern resulting from the "sloped" Dirksen monitor structure of FIG. 1(a) and the "ideal" Dirksen monitor structure of FIG. 1(d), respectively.

It is noted that the printing conditions utilized to produce the resist profiles illustrated in FIGS. 1(b) and 1(e) were as follows: a 0.68 NA with 0.8 partial coherence at +0.1 $\mu$m de-focus, utilizing a Shipley UV6 resist with a thickness of 0.4 $\mu$m on an organic BARC (AR2) on top of a polysilicon wafer. The simulation introduced a +0.025$\lambda$ coma for both X & Y (Z7 and Z8 of Zernike terms).

Upon a closer examination of the ring-shaped resist patterns formed by the Dirksen monitor structures, as shown for example in FIGS. 1(c) and 1(f), it is clear that the inner ring of the printed resist pattern has a relatively sloppy resist profile in contrast to the steep profile formed by the outer ring structure. The reason for this variation is that the outer-ring resist pattern is formed by the phase change in the mask, while the inner ring resist pattern is formed without any such phase change. Specifically, the inner ring resist pattern is formed via the attenuation of the exposure wavelength that is passed through the center of the Dirksen monitor pattern. In other words, the two resist profiles (i.e., the inner ring and the outer ring) are formed by two inherently different log-slopes of the respective aerial images. The difference in resist profiles can lead to erroneous registration measurements, which can cause a misinterpretation of the lens aberration in question.

It is noted that it is possible to observe a slight coma with the Dirksen lens aberration monitor, as shown in FIGS. 1(e) and (f). Specifically, the width of the ring is different on the left side as compared to the right side. It is further noted that it is difficult to observe this coma in the "sloped" Dirksen monitor, as shown in FIGS. 1(b) and 1(c).

Accordingly, in view of the foregoing problems, there remains a need for a lens monitor that allows for the detection of lens aberrations, but which is not easily impaired by slight imperfections in the mask making process. It is also desirable that the lens monitor structures be small enough such that they can be positioned in numerous places between or beside production die for in-situ lens monitoring purposes. It is also desirable that the lens monitor can be fabricated without requiring extra mask making process steps.

SUMMARY OF THE INVENTION

In an effort to solve the aforementioned needs, it is an object of the present invention to provide a lens monitor capable of detecting lens aberrations, where the lens monitor structures are sufficiently small in size so as to allow the monitor to be utilized for in-situ production monitoring, and which monitor does not require extra processing steps during mask formation. In addition, the functionality of the lens monitor should not be significantly impaired by minor imperfections in the mask formation process.

More specifically, the present invention relates to a lens aberration monitor for detecting lens aberrations. The lens aberration monitor comprises a mask for transferring a lithographic pattern onto a substrate, and a plurality of non-resolvable features disposed on the mask. The plurality of non-resolvable features are arranged so as to form a predetermined pattern on the substrate. The predetermined pattern is then utilized to detect lens aberrations. The size of the monitor is such that the mask can also contain a lithographic pattern corresponding to a device (e.g., an integrated circuit) to be formed on the substrate.

The present invention also relates to a method of detecting aberrations associated with a projection lens utilized in an optical lithography system. The method comprises the steps of forming a mask for transferring a lithographic pattern onto a substrate, forming a plurality of non-resolvable features disposed on the mask, where the plurality of non-resolvable features are arranged so as to form a predetermined pattern on the substrate, imaging the mask using the optical lithography system so as to print the mask on the substrate, and analyzing the position of the predetermined pattern formed on the substrate and the position of the plurality of non-resolvable features disposed on the mask so as to determine if there is an aberration. As explained below, if the position of the predetermined pattern differs from an expected position, which is determined from the position of the plurality of non-resolvable features, this shift from the expected position indicates the presence of an aberration.

As described in further detail below, the present invention provides significant advantages over the prior art. Most importantly, the present invention provides a lens monitor capable of detecting very subtle lens aberrations, and is substantially immune to deficiencies in the masking formation process utilized to form the monitor.

In addition, the lens monitor of the present invention is suitable for in-situ monitoring, as the lens monitor can be formed utilizing the same mask formation process required to form the production mask, and therefore does not require any additional mask formation processing steps. Furthermore, as the overall size of the lens monitor structures are sufficiently small, the monitor structures can be positioned in a sufficient number of positions in so as to allow for monitoring of the entire exposure field.

Yet another advantage is that the effectiveness of the lens monitor is relatively insensitive to both of the "sloped" phase edges and the "corner rounding" effects that are inherent to mask making process.

Additional advantages of the present invention will become apparent to those skilled in the art from the following detailed description of exemplary embodiments of the present invention.

BRIEF DESCRIPTION OF THE DRAWINGS

FIG. 3(a) illustrates an exemplary lens aberration monitor structure in accordance with the present invention.

FIG. 4(a) illustrates the object phase spectrum produced by the Dirksen monitor structure of FIG. 1.

FIG. 4(b) illustrates the object phase spectrum produced by the "ring-like" monitor structure of FIG. 2.

FIG. 4(c) illustrates the object phase spectrum produced by the lens aberration monitor structure illustrated in FIG. 3(a).

FIG. 4(d) illustrates a 1-D cross-sectional aerial image produced by the Dirksen monitor structure of FIG. 1.

FIG. 4(e) illustrates a 1-D cross-sectional aerial image produced by the "ring-like" monitor structure of FIG. 2.

FIG. 4(f) illustrates a 1-D cross-sectional aerial image produced by the lens aberration monitor structure of FIG. 3(a).

FIGS. 5(a)–5(c) illustrates the actual printing performance of the lens aberration monitor structure illustrated in FIG. 3(a).

The invention itself, together with further objects and advantages, can be better understood by reference to the following detailed description and the accompanying drawings.

DETAILED DESCRIPTION OF THE INVENTION

The following detailed description of the lens aberration monitor of the present invention relates to both the lens monitor itself as well as a method of forming the lens aberration monitor. It is noted that in an effort to facilitate the understanding of the present invention, the following description details how the lens monitor can be utilized to form ring-shaped lens monitors structures. However, it is also noted that the present invention is not limited to such ring-shaped lens structures. Clearly, other shapes are possible.

From the observations described above with regard to the Dirksen monitor, the inventors of the present invention initially thought that the resist profile of the inner ring of Dirksen's monitor structure could be improved by modifying the monitor such that it exhibited a ring-like structure. In other words, the degraded/sloppy resist profile of the inner ring of Dirksen's monitor structure could be corrected by creating a phase change at the center of the structure. However, contrary to the initial thoughts, the inventor of the present invention determined that creating a phase change at the center of the Dirksen structure did not result in the corresponding resist profile exhibiting a ring-like structure.

Moreover, the resulting resist profile was essentially useless for monitoring lens aberration.

Figure 1A:
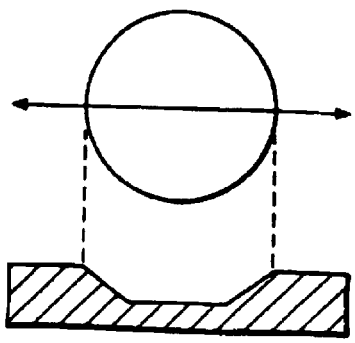
FIG. 1(a) illustrates a top and cross-sectional view of a "sloped" Dirksen lens aberration monitor structure.
Figure 1D:
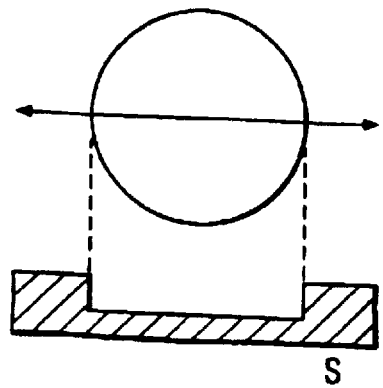
FIG. 1(d) illustrates a top and cross-sectional view of an "ideal" Dirksen lens aberration monitor structure.
Figure 1B:
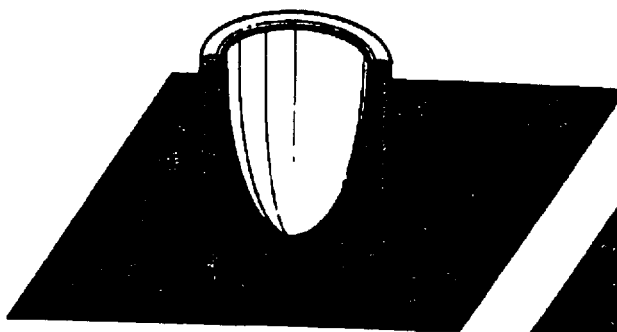
FIG. 1(b) illustrates a cross-sectional view of the printed resist pattern resulting from the "sloped" Dirksen lens aberration monitor structure of FIG. 1(a).
Figure 1E:
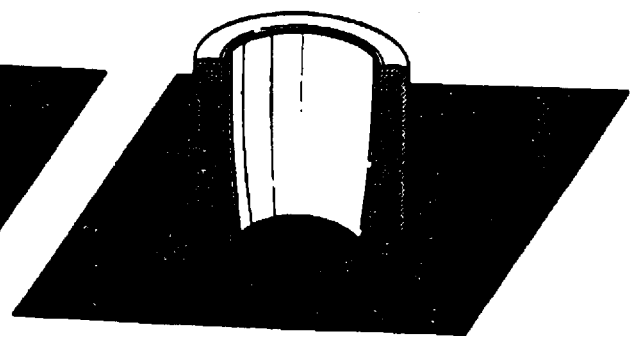
FIG. 1(e) illustrates a cross-sectional view of the printed resist pattern resulting from the "ideal" Dirksen lens aberration monitor structure of FIG. 1(d).
Figure 1C:
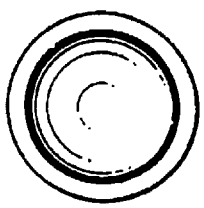
FIG. 1(c) illustrates a top view of the resist pattern illustrated in FIG. 1(b).
Figure 1F:
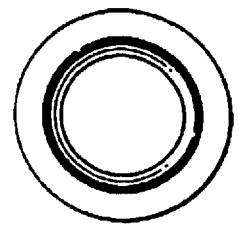
FIG. 1(f) illustrates a top view of the resist pattern illustrated in FIG. 1(e).
Figure 2A:
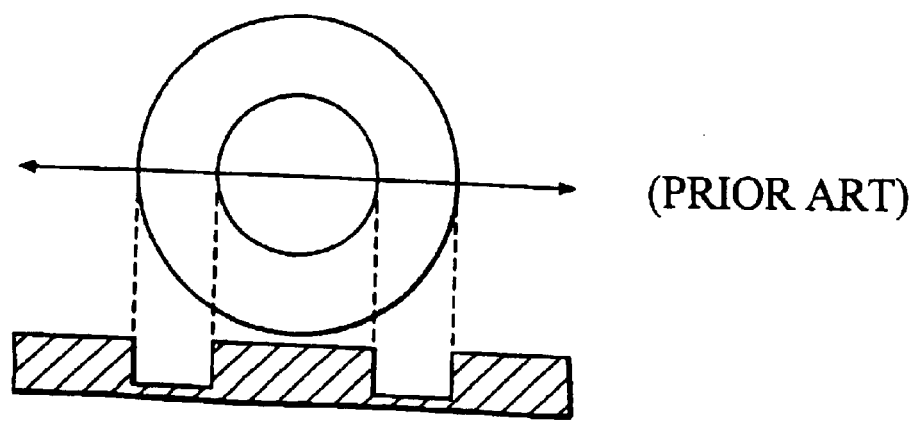
FIG. 2(a) illustrates a top and cross-sectional view of a Dirksen monitor structure modified so as to form a ring-like structure.
Figure 2B:
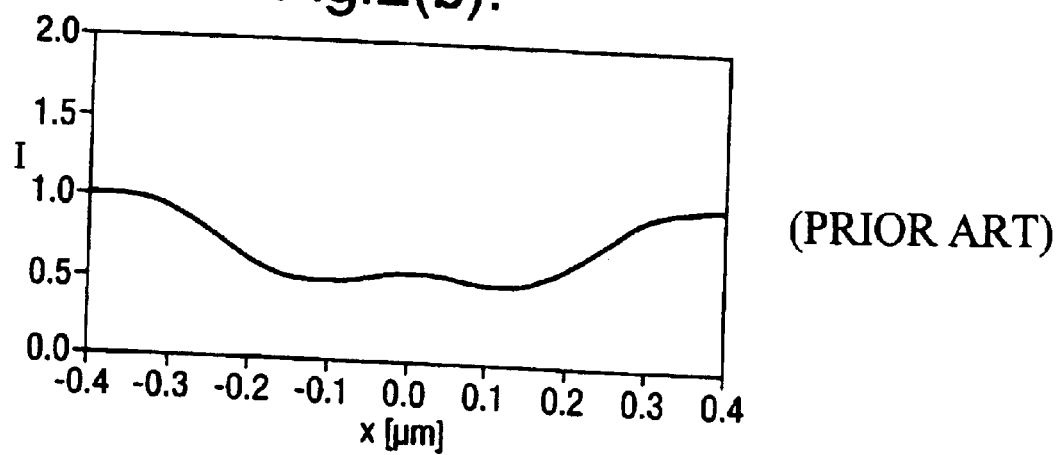
FIG. 2(b) is a one-dimensional cross-sectional aerial image of the ring-like structure monitor of FIG. 2(a).
Figure 2C:
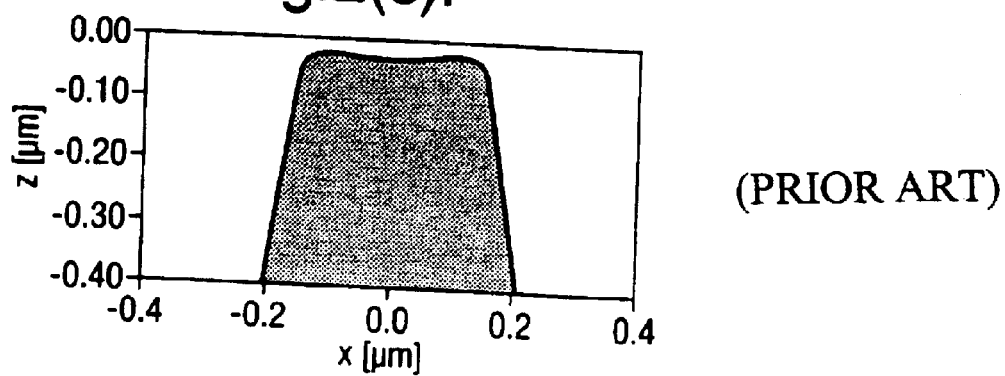
FIG. 2(c) is a cross-sectional view of the printed resist pattern resulting from the ring-like monitor structure of FIG. 2(a).

FIGS. 2(a)–2(c) illustrate the Dirksen monitor structure modified to form a ring-like structure. Specifically, FIG. 2(a) illustrates a top and cross-sectional view of the Dirksen structure modified so as to form a ring-like structure. FIG. 2(b) is a one-dimensional cross-sectional aerial image of the ring-like structure of FIG. 2(a). FIG. 2(c) is a cross-sectional view of the printed resist pattern resulting from the ring-like structure of FIG. 2(a). As is clear from a review of FIGS. 2(a)–2(c), the ring-like structure (FIG. 2(a)) does not produce a ring-shaped resist profile. This is due to the fact that the aerial image of the monitor structure does not have sufficient contrast to allow for patterning of a "ring like" resist structure. As a result, the structure of FIG. 2(a) is essentially useless for monitoring lens aberrations. It is noted that the foregoing is accurate as long as the diameter of the monitor structure is in the range of $\lambda$/NA. For a larger diameter, the ring-like design of FIG. 2(a) would likely print a ring-like resist pattern. However, as the diameter becomes larger than $\lambda$/NA, the effectiveness of lens aberration monitoring becomes diminished.

In view of the foregoing, one of the primary objectives of the present invention is to provide a lens aberration monitor having structures with an effective diameter in the range of $\lambda$/NA, which produce an aerial image having log-slopes which are steep enough to be sufficiently sensitive to indicate minute lens aberration.

FIG. 3(a) illustrates an exemplary lens aberration monitor structure 10 in accordance with the present invention. As shown, the lens aberration structure 10, which is referred to as an octad halftone ring (OHR), is a sub-resolution halftoning structure comprising a plurality of sub-resolution features 12. A detailed discussion of the formation of sub-resolution halftoning structures is set forth in U.S. Pat. application Ser. No. 09/270,052 filed on Mar. 16, 1999, which is hereby incorporated by reference.

In the embodiment illustrated in FIG. 3(a), the overall shape of the sub-resolution halftoning structure 10 is circular, while each of the features 12 exhibits a square shape. It is noted that the aberration monitor structure 10 of the present invention is not limited to such shapes. Clearly, the overall shape of the sub-resolution halftoning structure 10 can be other than circular, and the shape of each feature 12 can be other than square. It is noted that the square-shaped sub-resolution features 12 are likely to become corner rounded in an actual design due to the nature of mask making process.

Referring to FIG. 3(a), the size of the individual features 12 and the spacing between the features 12 are as follows. In an exemplary embodiment, the dimension of each side of the square features is approximately 0.3($\lambda$/NA) or less. It is noted that the mask making resolution limits the minimum size for sub-resolution features 12. For today's production mask making process, the resolution limit is in the range of approximately 200 nm on a 4×mask. On a 1×wafer scale, this is equivalent to 50 nm. For example, when utilizing a 0.68 NA stepper with a KrF exposure source, the size of each square feature 12 can be approximately 100 nm–120 nm per side. In order to maintain a sufficient halftoning effect, it is preferable that the spacing between each square feature 12 be less than 0.15 ($\lambda$/NA). Alternatively, the spacing between each feature 12 should be less than about one-half of the square feature's 12 side dimension. It is noted that, as shown in FIG. 3(a), the foregoing spacing requirements refer to the spacing between adjacent features 12. It is further noted that, as shown in FIG. 3(a), the staggered offset in the X and Y direction are preferably the same. In other words, the portion of a feature 12 overlapping an adjacent feature in either the X direction or the Y direction is preferably the same. In the current embodiment, the preferred staggered offset is in the range of approximately ¼ to ¾ of the sub-resolution element size. Finally, again referring to FIG. 3(a), it is further noted that the distance between the inner edges of the two opposing features having the greatest distance therebetween, taken along the X direction (i.e., features 12a, 12b) or the Y direction (i.e., features 12c, 12d), is preferably approximately equal to ($\lambda$/NA). All dimensions are indicated in 1X wafer scale.

In the embodiment of the lens aberration monitor illustrated in FIG. 3(a), the sub-resolution halftoning structure 10 of the present invention utilizes eight square features 12 arranged in a ring-like format. However, as stated, it is not intended that the present invention be so limited. Clearly, it is possible to generate and utilize a sub-resolution halftoning structure which does not exhibit a ring-like shape. It is also possible to form the sub-resolution halftoning structure utilizing a plurality of sub-resolution features having a total number other than eight, as it possible to utilize features having a shape other than square.

Figure 3D:
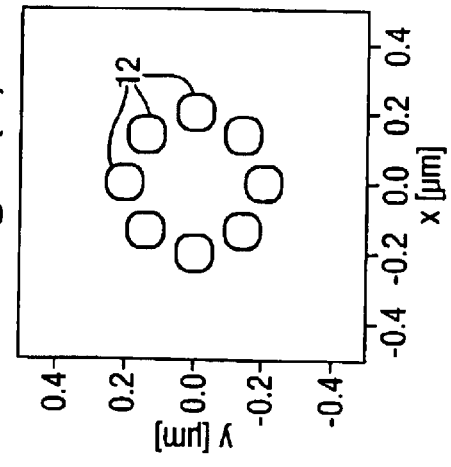
FIGS. 3(b)–3(g) illustrate exemplary variations of the lens aberration monitor structure illustrated in FIG. 3(a) and the printing performance thereof.
Figure 3C:
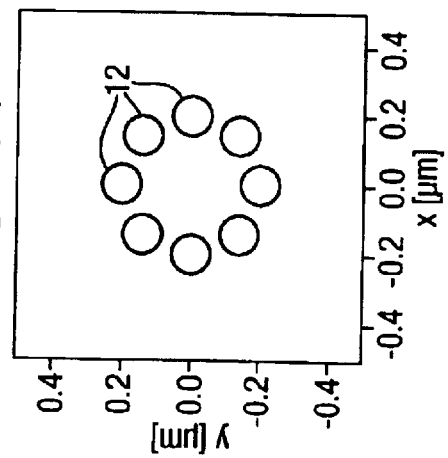
Figure 3B:
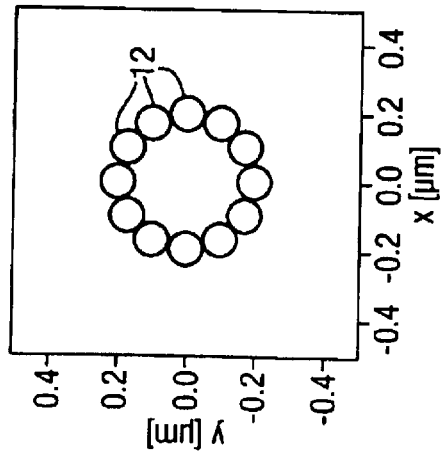
Figure 3G:
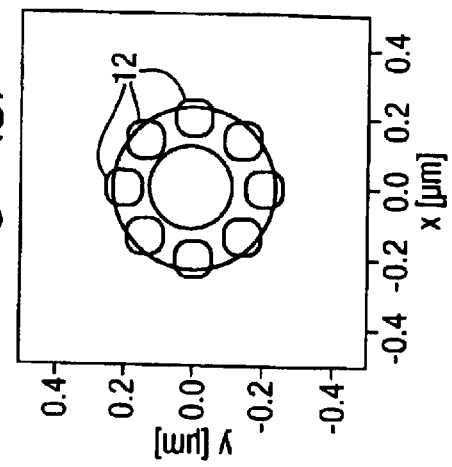
Figure 3F:
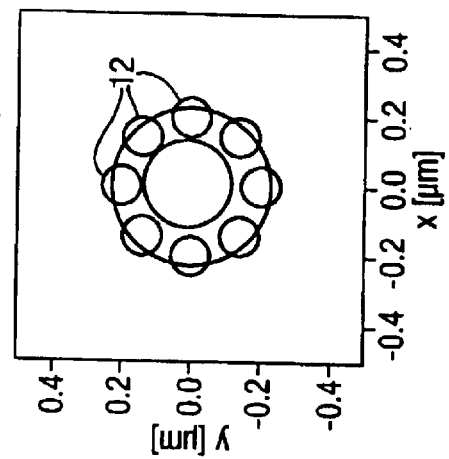
Figure 3E:
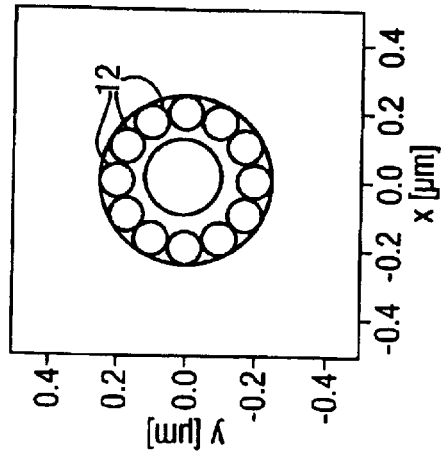

More specifically, although line-like structures (e.g., a pair of parallel lines) can show certain types of lens aberration (e.g., coma), it is desirable to form a "ring-like" structure in order to capture other forms of the lens aberration and their corresponding orientation. Further, because each feature 12 is sub-resolution, the particular shape is not of concern. The size of the feature 12 and halftone spacing is more critical. FIGS. 3(b), 3(c) and 3(d) are examples of various configurations and shapes of the sub-resolution features 12 that can be utilized to form monitor structure. FIGS. 3(e), 3(f) and 3(g) illustrates the actual printing performance of the monitor structures illustrated in FIGS. 3(b), 3(c) and 3(d), respectively. All of the exposures were performed under the same conditions, namely 0.68 NA with annular illumination (0.8 inner sigma and 0.6 outer sigma). In addition, in each example, a 0.05$\lambda$ of X and Y coma were purposely introduced. For all the three examples, the coma lens aberration can be clearly observed from the printed patterns illustrated in FIGS. 3(e), 3(f) and 3(g).

FIGS. 4(a)–4(f) illustrate a comparison of the object spectrums and the aerial images of the Dirksen monitor structure (FIG. 1), the ring-like monitor structure (FIG. 2) and the OHR monitor structure of the present invention (FIG. 3(a)). More specifically, referring first to FIG. 4(a), it is shown that the phase object spectrum of the Dirksen monitor is not symmetrical within the ±NA (numerical aperture) limits. Turning to FIG. 4(b), it is shown that the "ring-like" monitor has a symmetrical phase spectrum but the overall phase range is compressed. However, as explained above and illustrated in FIG. 4(e), the "ring-like" monitor structure exhibits insufficient aerial image contrast, and is therefore incapable of printing a ring-like resist pattern.

Turning to FIG. 4(c), it is shown that the OHR monitor 10 exhibits a symmetrical phase spectrum within the ±NA limits, while having a full phase range from 0 to 360 degrees. The aerial image corresponding to the OHR monitor 10 (as shown in FIG. 4(f)) appears similar to the aerial image produced by the Dirksen monitor (as shown in FIG. 4(d)) when the two are compared at the printing threshold of ≈0.3 to 0.35 intensity levels. However, although it is not readily apparent, at the threshold intensity levels, the log-slopes for inner and outer aerial images are more balanced for the OHR monitor structure 10. This is indicated by the pair of arrows depicted in both FIG. 4(d) and FIG. 4(f).

FIGS. 5(a)–5(c) illustrate the actual printing performance of the OHR lens monitor structure 10 illustrated in FIG. 3(a). The printing conditions utilized to produce FIGS. 5(a)–5(c) are the same as those described above with regard to FIGS. 1(a)–1(f). FIG. 5(a) illustrates a two-dimensional aerial image of the OHR monitor structure 10 as projected on the projection lens. FIG. 5(b) illustrates a top view of the original resist patterns (i.e., features 12) overlapped with the resulting OHR monitor structure (i.e., the OHR monitor structure formed as a result of the printing process). As shown in FIGS. 5(a)–5(c), even very subtle coma aberrations can be easily detected by the monitor.

More specifically, the coma aberration (0.025λ for both Z7 and Z8) introduced in the simulation can be observed in the 2-D aerial image of FIG. 5(a) as well as in FIG. 5(b). Referring to FIG. 5(b), the aberration is indicated by the shift of the inner ring 14 of the printed OHR structure to the upper right. Finally, FIG. 5(c), which is a cross-sectional view of the printed OHR structure, illustrates that the inner portion 16 of the left side of the printed OHR structure (of the given cross-sectional view) is shifted more towards the center than the corresponding inner portion 17 of the right side of the printed OHR structure. Each of the foregoing shifts/variations of the location of the OHR structure indicate the existence of a lens aberration. In the event there was no lens aberration, the inner ring 14 of FIG. 5(b) would be equally spaced from each of the square features 12 utilized to form the OHR monitor structure 10. In addition, both of the resist patterns 16, 17 of FIG. 5(c) would be equally spaced from the center.

It is noted that in use, the OHR monitor, which is printed in the scribe line or within the die so as to not interfere with the circuit action, would be measured so as to monitor the actual lens aberration in the corresponding exposure field. The lens aberration is then utilized to compute the necessary corrective action required to minimize the CD error. The corrective action can be accomplished, for example, by varying the mask pattern or by tuning the exposure tool. As described herein, the amount of lens aberration can be determined by measuring the relative ring width or the relative position shift of the inner ring circle in relation to a known reference structure that is not sensitive to lens aberration. Another possible method is by taking a SEM photo of the printed OHR pattern and comparing it to a family of OHR patterns with known lens aberrations. Using statistical analysis, it is possible to determine the magnitude and type of lens aberration with reliable repeatability.

Figure 6A:
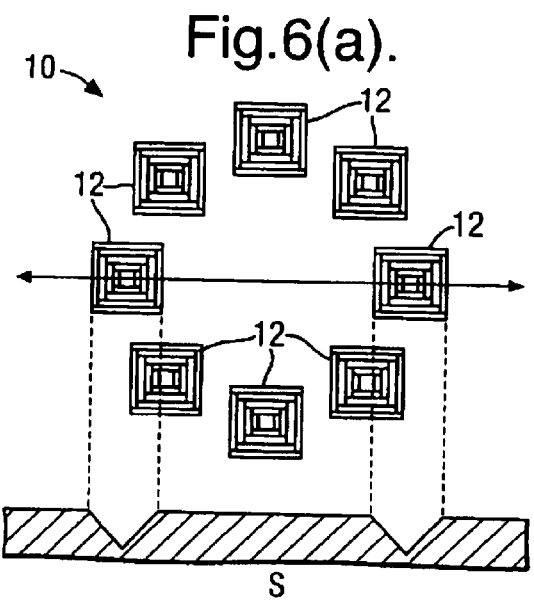
FIG. 6(a) illustrates a top and cross-sectional view of the lens aberration monitor structure of FIG. 3(a), wherein the mask formation process results in the non-resolvable features having sloped edges.
Figure 6B:
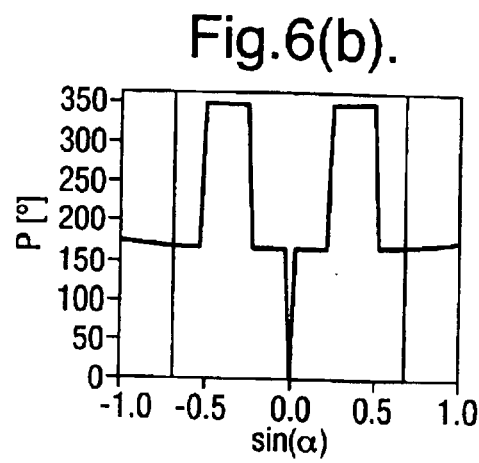
FIG. 6(b) illustrates the object phase spectrum produced by the lens aberration monitor structure illustrated in FIG. 6(a).
Figure 6C:
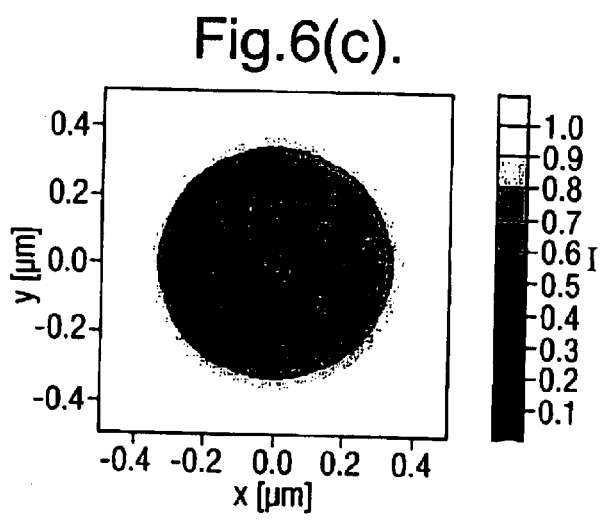
FIG. 6(c) illustrates a two-dimensional aerial image of the lens aberration monitor structure illustrated in FIG. 6(a) as projected by the projection lens.
Figure 6D:
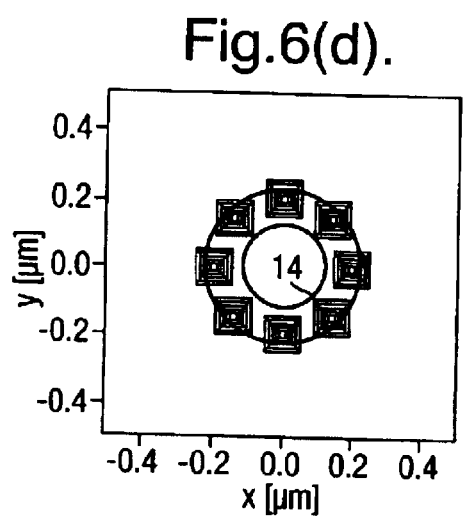
FIG. 6(d) illustrates a top view of the original resist patterns of FIG. 6(a) overlapped with the resulting lens aberration monitor structure printed on a wafer.
Figure 6E:
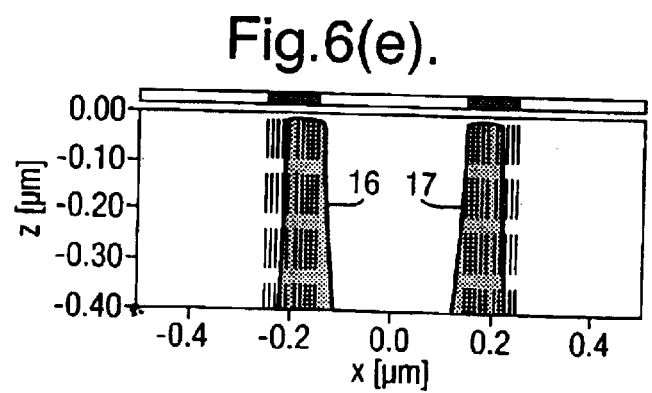
FIG. 6(e) is a cross-sectional view of the resulting lens aberration monitor structure corresponding to the monitor structure of FIG. 6(a).

One important point regarding the OHR monitor of the present invention is that the performance of the monitor is not degraded as a result of an imperfect mask making process. More specifically, the OHR monitor does not lose lens-aberration detection sensitivity if the quartz etch results in sloped phase edges on the mask. FIG. 6(a) illustrates a top and cross-sectional view of the OHR monitor structure 10 formed in the mask, wherein the mask formation process results in square features 12 having sloped edges. The sloped edges are a result of an imperfect quartz edge process utilized during formation of the mask. However, referring to FIG. 6(b), it is shown that the sloped quartz phase-edge patterns on the mask do not have a noticeable influence on the object phase spectrum. The total object spectrum phase is only slightly compressed (to about 350 degrees). Such compression may result in a very slight reduction in the sensitivity of the lens aberration detection monitor. More importantly, however, even for such an extreme sloppy phase edge, as shown in FIGS. 6(c)–6(e), there is little impact on the printed resist profiles. Thus, in comparison to Dirksen's monitor, the OHR monitor of the present invention provides a much more versatile monitor. It is noted that the printing conditions utilized to produce FIGS. 6(c)–6(e) are the same as those described above with regard to FIGS. 1(a)–1(f).

As previously stated, it is desirable to utilize the lens aberration monitor of the present invention for in-situ monitoring during the production printing process. In order to accomplish this objective, it is necessary to satisfy the following two requirements:

(1) the lens aberration monitor must be made using the same mask making process, with no additional processing steps; and
(2) the lens aberration monitor structure must be usable and effective when printed under the same exposure conditions as intended for printing of the production patterns.

The OHR monitor of the present invention is capable of meeting both requirements. FIGS. 7(a)–7(d) demonstrate the ability of the OHR monitor of the present invention to be utilized on a 6% attPSM or a binary chrome mask. It is noted that the printing conditions utilized to produce FIGS. 7(a)–7(d) are the same as those described above with regard to FIGS. 1(a)–1(f).

Figure 7A:
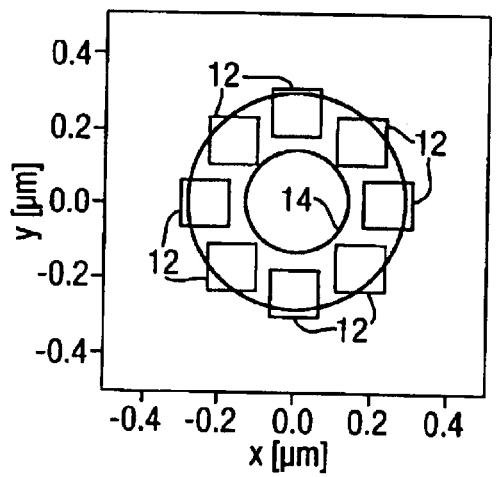
FIGS. 7(a)–7(d) demonstrate the ability of the lens aberration monitor of the present invention to be utilized in conjunction with a 6% attPSM or a binary chrome mask.
Figure 7B:
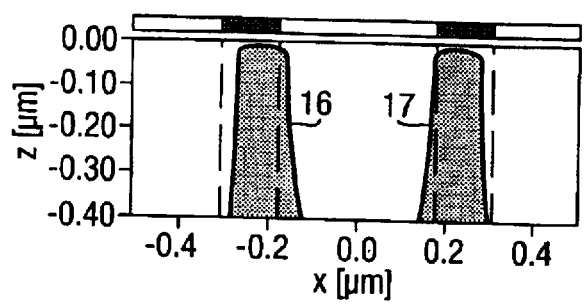
Figure 7C:
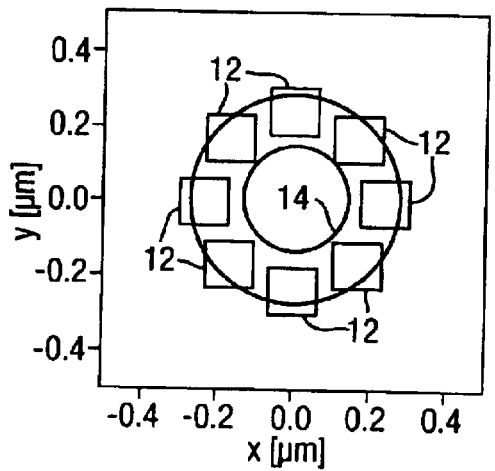
Figure 7D:
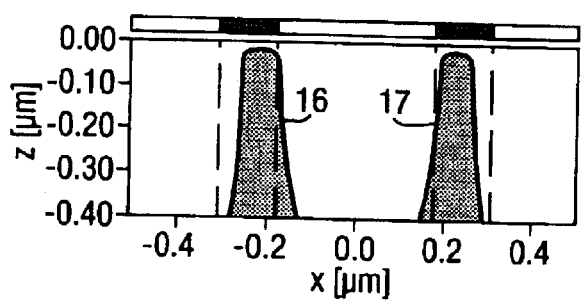

More specifically, FIG. 7(a) illustrates a top view of the resist patterns, which were formed on a 6% attPSM, overlapped with the resulting printed OHR monitor structure. FIG. 7(b) is a cross-sectional view of the printed OHR monitor structure resulting from the resist patterns of FIG. 7(a). FIG. 7(c) illustrates a top view of the resist patterns, which were formed on a binary chrome mask, overlapped with the resulting printed OHR monitor structure. FIG. 7(d) is a cross-sectional view of the printed OHR monitor structure resulting from the resist patterns of FIG. 7(c).

As is clear from FIGS. 7(a)–7(d), both the OHR monitor structure formed utilizing 6% attPSM and the OHR monitor structure formed utilizing the binary chrome mask are capable of detecting minute lens aberrations (e.g., 0.025λ). For example, the inner ring 14 of the resulting OHR monitor structure in both FIGS. 7(a) and 7(c) is shifted in the upper-right direction, in the manner similar to the OHR monitor structure illustrated in FIG. 5(b), thereby effectively detecting the 0.025λ lens aberration introduced in the simulation.

It is noted that in order to ensure that the same exposure levels can be utilized along with the associated product patterns, the dimension of the OHR square elements 12 were re-sized to be ≈0.35(λ/NA) for both 6% attPSM and binary chrome mask application. There was no change for the other OHR design parameters. However, due to the use of a slightly larger square element, it may prove necessary to re-tune the spacing between each square element to best optimize the halftoning effect.

As stated above, the OHR monitor of the present invention is quite versatile. For example, in addition to the detection of coma aberrations, as illustrated above in conjunction with FIGS. 5, 6 and 7, the OHR monitor is also capable of detecting various other types of lens aberrations. FIGS. 8(a)–8(h) illustrate the capability of the OHR monitor to detect lens aberrations. It is noted that the printing conditions utilized to produce FIGS. 8(a)–8(h) are the same as those described above with regard to FIGS. 1(a)–1(f), except for the lens aberration settings, and all with +0.1 μm de-focus.

Figure 8A:
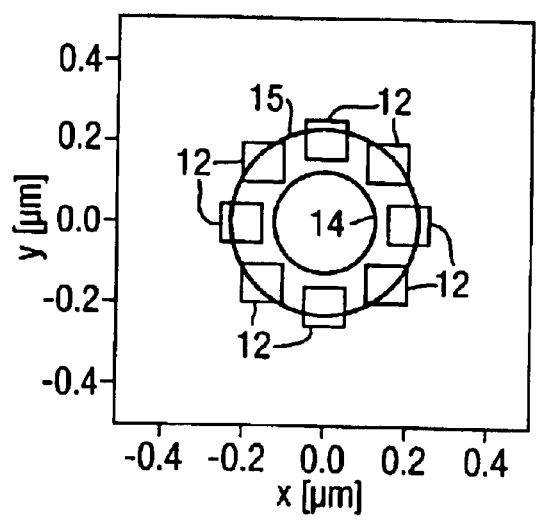
FIGS. 8(a)–8(h) illustrate the capability of the lens aberration monitor of the present invention to detect lens aberrations.
Figure 8E:
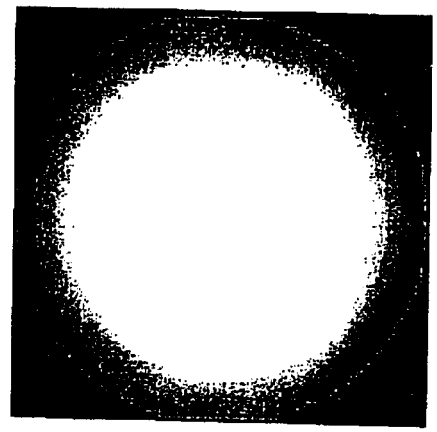

FIG. 8(a) illustrates a top view of the resist patterns utilized to form the OHR monitor structure overlapped with the resulting OHR monitor structure printed from a diffraction-limited lens. FIG. 8(e) illustrates the wavefront at the projection lens pupil corresponding to the OHR monitor of FIG. 8(a). As shown, the printed OHR monitor structure indicates that the lens is substantially aberration free, as both the inner ring 14 and the outer ring 15 are in the expected position.

Figure 8B:
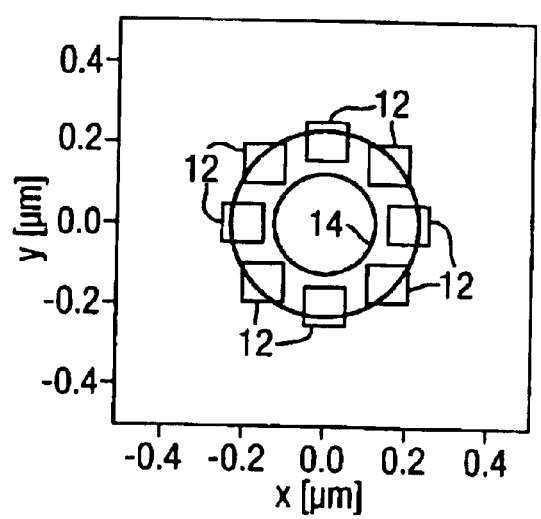
Figure 8F:
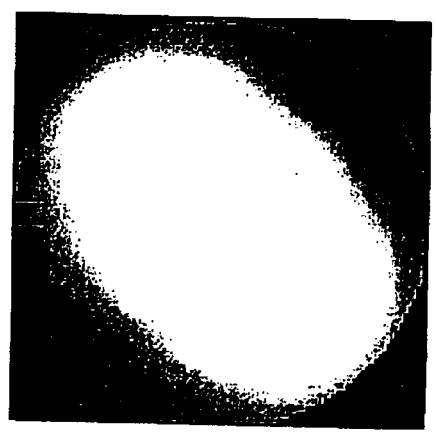

FIG. 8(b) illustrates a top view of the resist patterns of the lens aberration monitor structure printed with a lens aberration of 0.05λ and 45 degree astigmatism, overlapped with the resulting OHR monitor structure. FIG. 8(f) illustrates the wavefront at the projection lens pupil corresponding to the OHR monitor structure of FIG. 8(b). As shown, the printed OHR monitor structure reveals the lens aberration by the elongation of the inner ring 14 about the 45 degree axis.

Figure 8C:
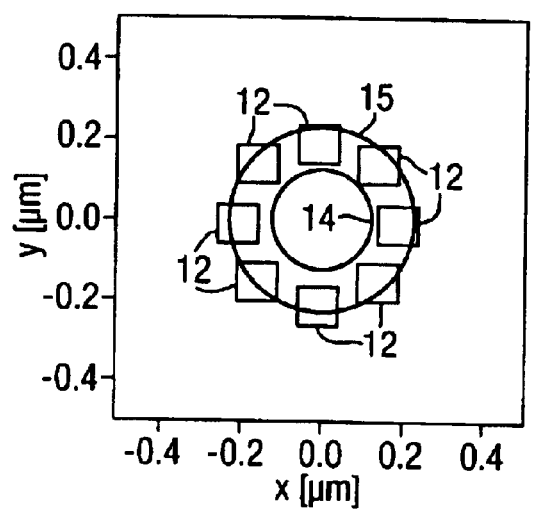
Figure 8G:
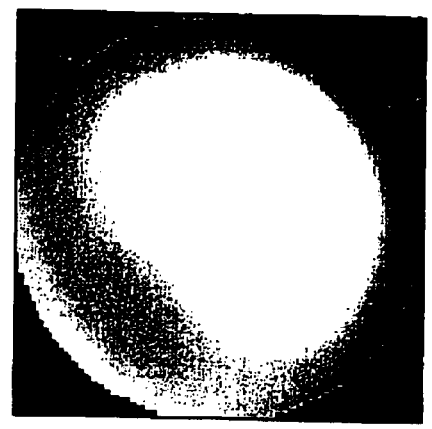

FIG. 8(c) illustrates a top view of the resist patterns of the lens aberration monitor structure printed with a lens aberration of 0.05λ and X and Y coma (Z7 and Z8), overlapped with the resulting OHR monitor structure. FIG. 8(g) illustrates the wavefront at the projection lens pupil corresponding to the OHR monitor structure of FIG. 8(c). As shown, the printed OHR monitor structure indicates the lens aberration by the shifting of both the inner ring 14 and the outer ring 15 in both the upward and right directions.

Figure 8D:
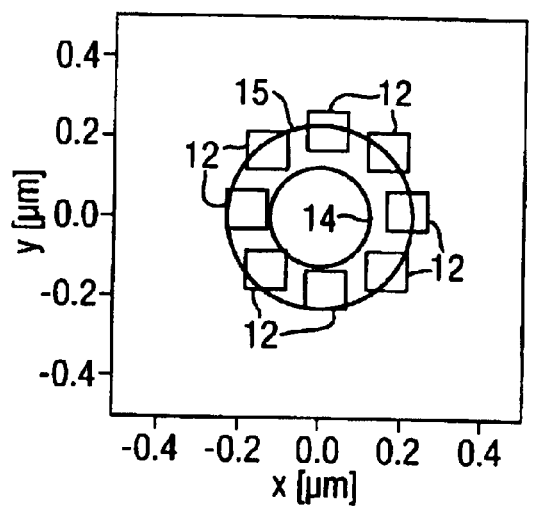
Figure 8H:
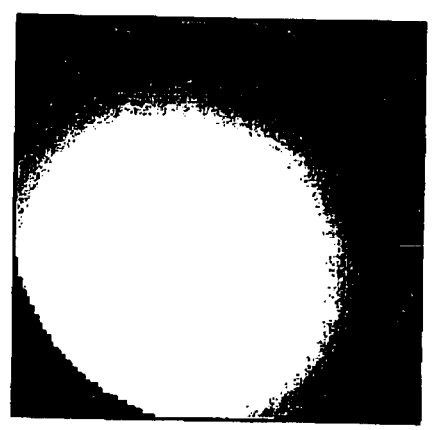

FIG. 8(d) illustrates a top view of the resist patterns of the lens aberration monitor structure printed with a lens aberration of 0.05λ and X and Y tilt (Z2 and Z3), overlapped with the resulting OHR monitor structure. FIG. 8(h) illustrates the wavefront at the projection lens pupil corresponding to the OHR monitor structure of FIG. 8(d). As shown, the printed OHR monitor structure indicates the lens aberration by the shifting of both the inner ring 14 and the outer ring 15 in both the downward and left directions.

Accordingly, even though actual lens aberrations can be very complicated and subtle, by the combined use of the OHR monitor of the present invention and state-of-the-art metrology tools, it is possible to analyze the underlying cause of lens aberrations. It is noted that the lens aberrations identified above in conjunction with FIGS. 8(a)–8(h) are also apparent when viewing the wavefronts projected on the projection lens pupil as illustrated in FIGS. 8(f)–8(h).

As mentioned above, variations of the exemplary embodiment of the OHR monitor of the present invention are possible. For example, while the exemplary OHR monitor structure is formed in the shape of a ring, clearly other shapes are possible. In addition, the individual features utilized to form the OHR monitor structure may be formed in a shape other than a square.

Furthermore, the OHR can be utilized in all types of mask, for example, binary chrome, attPSM, alternating PSM, and chrome-less PSM. Since the OHR design indicates that such structure and feature spacing can be very sensitive to lens aberration, the OHR design dimensions can be used as a reference for the "forbidden" design rule for integrated circuit design. As such, the circuit features can become less sensitive to minute lens aberrations. This can be extremely important for memory circuit or library circuit design, with the result being enhanced/improved CD control.

Finally, it is also noted that although specific reference may be made in the foregoing description to the use of lithographic projection apparatus in the manufacture of integrated circuits, it should be explicitly understood that such apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciated that, in the context of such alternative applications, any use of the terms "reticle" or "wafer" in this text should be considered as being replaced by the more general terms "mask" or "substrate", respectively.

As described above, the OHR monitor of the present invention provides important advantages over the prior art. Most importantly, the present invention provides a lens monitor which is capable of detecting very subtle lens aberrations, and which is substantially immune to deficiencies in the masking formation process utilized to form the monitor.

In addition, the lens aberration monitor of the present invention is suitable for in-situ monitoring, as the lens monitor can be formed utilizing the same mask formation process required to form the production mask, and therefore does not require any additional mask formation processing steps. Furthermore, as the overall size of the lens monitor structure is sufficiently small, the structure can be positioned in a sufficient number of positions so as to allow for monitoring of the entire exposure field.

In yet another advantage, because the lens aberration monitor structure of the present invention utilizes sub-resolution features, the actual shape and size of the features are not very critical, and therefore the lens aberration monitor is exceedingly effective in detecting aberrations in actual applications.

Although certain specific embodiments of the present invention have been disclosed, it is noted that the present invention may be embodied in other specific forms without departing from the spirit or essential characteristics thereof. The present embodiments are therefore to be considered in all respects as illustrative and not restrictive, the scope of the invention being indicated by the appended claims rather than the foregoing description, and all changes which come within the meaning and range of equivalency of the claims are therefore intended to be embraced therein.

What is claimed is:

1. A lens aberration monitor for detecting lens aberrations, said monitor comprising:
   a mask for transferring a lithographic pattern onto a substrate, and
   a plurality of sub-resolution features disposed on said mask, said plurality of sub-resolution features arranged so as to form a predetermined pattern on said substrate, said predetermined pattern being utilized to detect lens aberrations,
   wherein none of said plurality of sub-resolution features are individually imaged on said substrate.

2. The lens aberration monitor of claim 1, wherein each of said plurality of sub-resolution features has a square-shaped cross-sectional configuration, said plurality of sub-resolution features being positioned with respect to one another so as to form a circular-shape.

3. The lens aberration monitor of claim 2, wherein each of said plurality of sub-resolution features having said square-shaped cross-sectional configuration, exhibits a length of about 0.30 (λ/NA) or less per side, where λ equals the wavelength of a light source utilized to image said mask and NA equals the numerical aperture of an objective lens used to image the mask onto the substrate.

4. The lens aberration monitor of claim 2, wherein the spacing between adjacent edges of adjacent sub-resolution features is about 0.15 (λ/NA) or less per side, where λ equals the wavelength of a light source utilized to image said mask and NA equals the numerical aperture of an objective lens used to image the mask onto the substrate.

5. The lens aberration monitor of claim 2, wherein a first set of said plurality of sub-resolution features which are adjacent one another overlap in an X-direction, and a second set of said plurality of sub-resolution features overlap in a Y-direction, substantially orthogonal to said X-direction, said overlap in said X-direction being equal to said overlap in said Y-direction.

6. The lens aberration monitor of claim 1, wherein each of said plurality of sub-resolution features is a π-phase shifting element.

7. The lens aberration monitor of claim 1, wherein said predetermined pattern formed on said substrate is a ring-shaped pattern.

8. The lens aberration monitor of claim 1, wherein said mask further comprises a lithographic pattern corresponding to an integrated circuit to be formed on said substrate.

9. The lens aberration monitor of claim 1, wherein said mask is a 6% attenuated phase-shift mask.

10. The lens aberration monitor of claim 1, wherein said mask is a binary chrome mask.

11. A method of forming a lens aberration monitor for detecting lens aberrations, said method comprising the steps:
   forming a mask for transferring a lithographic pattern onto a substrate, and
   forming a plurality of sub-resolution features disposed on said mask, said plurality of sub-resolution features arranged so as to form a predetermined pattern on said substrate, said predetermined pattern being utilized to detect lens aberrations, wherein none of said plurality of sub-resolution features are individually imaged on said substrate.

12. The method of forming the lens aberration monitor of claim 11, wherein each of said plurality of sub-resolution features has a square-shaped cross-sectional configuration, said plurality of sub-resolution features being positioned with respect to one another so as to form a circular-shape.

13. The method of forming the lens aberration monitor of claim 12, wherein each of said plurality of sub-resolution features having said square-shaped cross-sectional configuration, exhibits a length of about 0.30 ($\lambda$/NA) or less per side, where $\lambda$ equals the wavelength of a light source utilized to image said mask and NA equals the numerical aperture of an objective lens used to image the mask onto the substrate.

14. The method of forming the lens aberration monitor of claim 12, wherein the spacing between adjacent edges of adjacent sub-resolution features is about 0.15 ($\lambda$/NA) or less per side, where $\lambda$ equals the wavelength of a light source utilized to image said mask and NA equals the numerical aperture of an objective lens used to image the mask onto the substrate.

15. The method of forming the lens aberration monitor of claim 12, wherein a first set of said plurality of sub-resolution features which are adjacent one another overlap in an X-direction, and a second set of said plurality of sub-resolution features overlap in a Y-direction, substantially orthogonal to said X-direction, said overlap in said X-direction being equal to said overlap in said Y-direction.

16. The method of forming the lens aberration monitor of claim 11, wherein each of said plurality of sub-resolution features is a π-phase shifting element.

17. The method of forming the lens aberration monitor of claim 11, wherein said predetermined pattern formed on said substrate is a ring-shaped pattern.

18. The method of forming the lens aberration monitor of claim 11. wherein said mask further comprises a lithographic pattern corresponding to an integrated circuit to be formed on said substrate.

19. The method of forming the lens aberration monitor of claim 11, wherein said mask is a 6% attenuated phase-shift mask.

20. The method of forming the lens aberration monitor of claim 11, wherein said mask is a binary chrome mask.

21. A lens aberration monitor for detecting lens aberrations, said monitor comprising:
   a mask for transferring a lithographic pattern onto a substrate,
   a plurality of sub-resolution features disposed on said mask, said plurality of sub-resolution features arranged so as to form a predetermined pattern on said substrate, said predetermined pattern being utilized to detect lens aberrations, and
   a lithographic pattern disposed on said mask, said lithographic corresponding to a device to be formed on said substrates,
   wherein none of said plurality of sub-resolution features are individually imaged on said substrate.

22. A method of detecting aberrations associated with a projection lens utilized in an optical lithography system, said method comprising the steps:
   forming a mask for transferring a lithographic pattern onto a substrate,
   forming a plurality of sub-resolution features disposed on said mask, said plurality of sub-resolution features arranged so as to form a predetermined pattern on said substrate,
   exposing said mask using an optical exposure tool so as to print said mask on said substrate, and
   analyzing the position of said predetermined pattern formed on said substrate and the position of said plurality of sub-resolution features disposed on said mask so as to determine if there is an aberration,
   wherein none of said plurality of sub-resolution features are individually imaged on said substrate.

23. The method of detecting aberrations associated with a projection lens utilized in an optical lithography system of claim 22, wherein each of said plurality of sub-resolution features has a square-shaped cross-sectional configuration, said plurality of sub-resolution features being positioned with respect to one another so as to form a circular-shape.

24. The method of detecting aberrations associated with a projection lens utilized in an optical lithography system of claim 23, wherein each of said plurality of sub-resolution features having said square-shaped cross-sectional configuration, exhibits a length of about 0.30 ($\lambda$/NA) or less per side, where $\lambda$ equals the wavelength of a light source utilized to image said mask and NA equals the numerical aperture of an objective lens used to image the mask onto the substrate.

25. The method of detecting aberrations associated with a projection lens utilized in an optical lithography system of claim 24, wherein the spacing between adjacent edges of adjacent sub-resolution features is about 0.15 ($\lambda$/NA) or less per side, where $\lambda$ equals the wavelength of a light source utilized to image said mask and NA equals the numerical aperture of an objective lens used to image the mask onto the substrate.

26. The method of detecting aberrations associated with a projection lens utilized in an optical lithography system of claim 22, wherein said predetermined pattern formed on said substrate is a ring-shaped pattern.

27. The method of detecting aberrations associated with a projection lens utilized in an optical lithography system of claim 22, wherein said mask further comprises a lithographic pattern corresponding to a device to be formed on said substrate.

28. The method of detecting aberrations associated with a projection lens utilized in an optical lithography system of claim 23, wherein a first set of said plurality of sub-resolution features which are adjacent one another overlap in an X-direction, and a second set of said plurality of sub-resolution features overlap in a Y-direction, substantially orthogonal to said x-direction, said overlap in said X-direction being equal to said overlap in said Y-direction.

29. The method of detecting aberrations associated with a projection lens utilized in an optical lithography system of claim 22, wherein each of said plurality of sub-resolution features is a π-phase shifting element.

30. The method of detecting aberrations associated with a projection lens utilized in an optical lithography system of claim 22, wherein said mask is a 6% attenuated phase-shift mask.

31. The method of detecting aberrations associated with a projection lens utilized in an optical lithography system of claim 22, wherein said mask is a binary chrome mask.

32. A device manufacturing method comprising the steps of:

(a) providing a substrate which is at least partially covered by a layer of radiation-sensitive material;

(b) providing a mask which contains a pattern;

(c) using a projection beam of radiation and an objective lens to project an image of at least part of the mask pattern onto a target area of the layer of radiation-sensitive material, wherein prior to performing step (c), an aberration monitoring step is performed comprising the step of forming a plurality of sub-resolution features on said mask, said plurality of sub-resolution features arranged so as to form a predetermined pattern on said substrate, said predetermined pattern being utilized to detect lens aberrations, and wherein none of said plurality of sub-resolution features are individually imaged on said substrate.

33. The device manufacturing method of claim 32, wherein each of said plurality of sub-resolution features has a square-shaped cross-sectional configuration, said plurality of sub-resolution features being positioned with respect to one another so as to form a circular-shape.

34. The device manufacturing method of claim 33, wherein each of said plurality of sub-resolution features having said square-shaped cross-sectional configuration, exhibits a length of about 0.30 ($\lambda$/NA) or less per side, where $\lambda$ equals the wavelength of a light source utilized to image said mask and NA equals the numerical aperture of the objective lens used to image the mask onto the substrate.

35. The device manufacturing method of claim 33, wherein the spacing between adjacent edges of adjacent sub-resolution features is about 0.15 ($\lambda$/NA) or less per side, where $\lambda$ equals the wavelength of a light source utilized to image said mask and NA equals the numerical aperture of an objective lens used to image the mask onto the substrate.

36. The device manufacturing method of claim 33, wherein a first set of said plurality of sub-resolution features which are adjacent one another overlap in an X-direction, and a second set of said plurality of sub-resolution features overlap in a Y-direction, substantially orthogonal to said X-direction, said overlap in said X-direction being equal to said overlap in said Y-direction.

37. The device manufacturing method of claim 32, wherein each of said plurality of sub-resolution features is a π-phase shifting element.

38. The device manufacturing method of claim 32, wherein said predetermined pattern formed on said substrate is a ring-shaped pattern.

39. The device manufacturing method of claim 32, wherein said pattern corresponds to an integrated circuit to be formed on said substrate.

40. The device manufacturing method of claim 32, wherein said mask is a 6% attenuated phase-shift mask.

41. The device manufacturing method of claim 32, wherein said mask is a binary chrome mask.

* * * * *